United States Patent [19]

Geris

[11] 4,012,257

[45] Mar. 15, 1977

[54] METHOD OF PRODUCING A GRAVURE PRINTING SURFACE UTILIZING A CONTINUOUS AND SCREENED NEGATIVE

[76] Inventor: Frank T. Geris, 2900 Maple Ave., Downers Grove, Ill. 60515

[22] Filed: Feb. 13, 1976

[21] Appl. No.: 658,028

Related U.S. Application Data

[63] Continuation-in-part of Ser. No. 516,171, Oct. 21, 1974, abandoned.

[52] U.S. Cl. .................... 96/36.4; 96/36.3; 96/37; 96/38; 96/41; 96/44; 96/45; 101/128.4; 156/664; 156/659; 204/129.65
[51] Int. Cl.$^2$ ......................... G03C 5/00
[58] Field of Search ............... 96/36.3, 37, 36, 44, 96/41, 45, 36.4, 38; 101/128.4, 150, 401.1; 156/16, 18; 204/129.65

[56] References Cited

UNITED STATES PATENTS

| | | | |
|---|---|---|---|
| 2,387,048 | 10/1945 | Alger | 96/37 X |
| 2,628,903 | 2/1953 | Kott | 96/38 X |
| 2,907,657 | 10/1959 | Kott | 96/38 X |
| 2,961,315 | 11/1960 | Stirling | 96/37 X |
| 3,325,285 | 6/1967 | Harris et al. | 96/38 |
| 3,394,652 | 7/1968 | Marsh | 96/38 X |
| 3,589,899 | 6/1971 | Hersh | 96/45 |
| 3,746,540 | 7/1973 | Rarery | 96/36.4 |
| 3,804,622 | 4/1974 | Bergin | 96/45 X |
| 3,809,555 | 5/1974 | Marley | 96/45 X |

*Primary Examiner* — Edward C. Kimlin
*Attorney, Agent, or Firm* — McDougall, Hersh & Scott

[57] ABSTRACT

A method of producing gravure printing surfaces is disclosed. The method utilizes a separately produced screened negative made on orthochromatic film and a continuous tone negative. Both negatives are superimposed to produce a positive with variable size dots and variable tone densities which are then utilized to expose the carbon tissue resist used to etch the printing surface. Alternatively, the negatives are utilized to produce corresponding positives each of which is used to expose the carbon tissue.

20 Claims, 5 Drawing Figures

METHOD OF PRODUCING A GRAVURE PRINTING SURFACE UTILIZING A CONTINUOUS AND SCREENED NEGATIVE

This application is a C-I-P of Ser. No. 516,171, now abandoned.

BACKGROUND OF THE INVENTION

This invention relates to rotogravure printing, i.e., printing from recessed wells that hold ink on a rotating printing plate or surface. A basic problem in gravure is to photographically translate a pattern of color tones, highlights and shadows into a pattern of recessed wells on the printing plates. These recessed wells receive the various colored inks which are then printed on paper. Over the course of development of rotogravure which extends well over fifty years, a number of methods or processes have been developed for producing gravure plates. In what is commonly termed "conventional gravure" a separate negative is made for each of the four colors used in full-color printing by photographing the copy through a different filter for each color. The negative plates receive extensive retouching and layout so that in the final reproduction there is a near correct relationship between the various elements of the copy. The negative plates are then utilized for making a continuous tone positive, again, one for each color. The positives are carefully inspected and additional retouching is performed. The corrected film positives are then used to expose a carbon tissue/resist used to etch the printing surface.

The carbon tissue is a pigmented gelatin emulsion which is sensitive to light. In the conventional gravure process, it is placed in a vacuum frame in contact with a 150-line conventional gravure screen and exposed to light. The light passing through the screen hardens the tissue, causing a screen pattern to form on the carbon tissue. Next, each film positive is placed in a vacuum frame with the carbon tissue and light is passed through the positives to transfer their image to the carbon tissue.

The carbon tissue thus prepared is laid on to the copper cylinders and a standard chemical etching process is performed whereby the exposed portions of the carbon tissue form a mask or resist. The resulting etched cylinder comprises a plurality of round or square wells which vary in depth.

In a modified version often referred to as the Dultgen Halftone Process, a printing cylinder is produced having squares or dots etched therein which vary in depth as well as in width. The Dultgen process is disclosed in U.S. Pat. No. 2,096,794. In the Dultgen process a soft focus negative is produced. From this soft focus negative a continuous tone positive is produced and used to expose the carbon tissue. The tissue is also exposed a second time, in several embodiments, by a halftone plate positive. After the image of both positives is transferred to the carbon tissue upon which a grain screen has been exposed, etching is accomplished in the conventional manner.

A study of the Dultgen patent discloses that in one embodiment a gravure printing plate is produced without exposing a grain screen on the carbon tissue. In this embodiment a halftone screened negative and a soft focus negative are used, a halftone screen being an alternating light and dark checkerboard arrangement. It is proposed that these two negatives be superimposed in register to produce a combined positive or alternately be used to produce separate positives which are used to twice expose the carbon tissue. As will be explained, the single positive variation using a halftone screen and glass positives does not produce satisfactory plates. Principally, this was due to the use of glass positives, the soft focus and the use of a halftone plate or screen.

The two-positive technique, however, is satisfactory especially when a lateral pillow cushion screen is used and has become a standard technique in the industry commonly referred to as the "hard dot process". In the hard dot process one lateral screened positive and one continuous tone positive are separately exposed on the carbon tissue resist prior to etching the copper cylinder. In using the hard dot process it is still necessary to perform the normal hand correcting of the continuous tone negative as well as highlighting, outlining, retouching of the negatives and the positives, and proofing the positives, as required for most gravure techniques.

It is accordingly an object of the present invention to provide an improved method for producing gravure etchings.

It is another object of the present invention to produce a gravure method for producing etchings which utilizes a single positive for producing the carbon tissue resist.

It is another object of the invention to provide a method of producing gravure printing surfaces without the need for substantial manual correcting by skilled gravure artists.

It is a further object of the present invention to provide a method of producing gravure printing which is low in cost and significantly faster than conventional techniques.

It is a further object of the present invention to provide a gravure etching method which eliminates a substantial portion of the negative and positive correcting and layout.

By way of comparison, in the current hard dot process, two positives are produced and separately printed upon the carbon tissue to produce the plates. The present method utilizes one positive for exposing the carbon tissue and thus eliminates the problem of maintaining register stability during exposure of the tissue. A 50% savings in time and clarity is often realized, as well as better color register.

Whether monotone or color etchings are being produced, the present method reduces the cost of producing the positives for etching the plates with a significant increase in quality. Truer color correction is inherently obtained because of the use of orthochromatic film. Corrections, such as are necessary, are all done photographically in a manner similar to the techniques currently used in offset printing. A significant reduction in the number of intermediate films used in conventional gravure techniques is also obtained.

Other objects and advantages of the invention will be apparent from the concluding portion of the specification.

BRIEF DESCRIPTION OF THE DRAWINGS

FIG. 6 is a flow diagram of another modified form of the invention.

SUMMARY OF THE INVENTION

This invention discloses an improved method for producing gravure plates for intaglio printing. Present-day methods require the use of highly skilled color separating craftsmen to determine tonal color balance and other characteristics for final printing reproduction. In the present method only one positive is used for each color. The present method produces a photographically corrected positive for printing on the carbon tissue resist used to etch the plates. This eliminates much of the hand correcting presently required.

Figure 2:
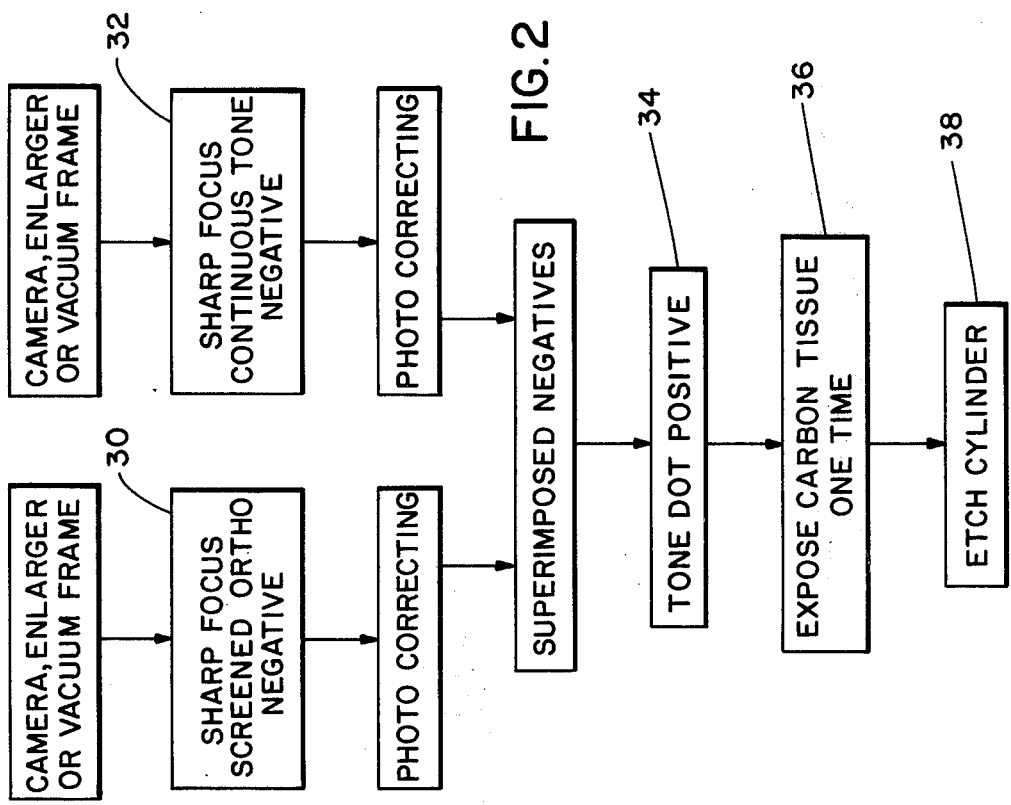
FIG. 2 is a flow diagram of the present method.
Figure 3:
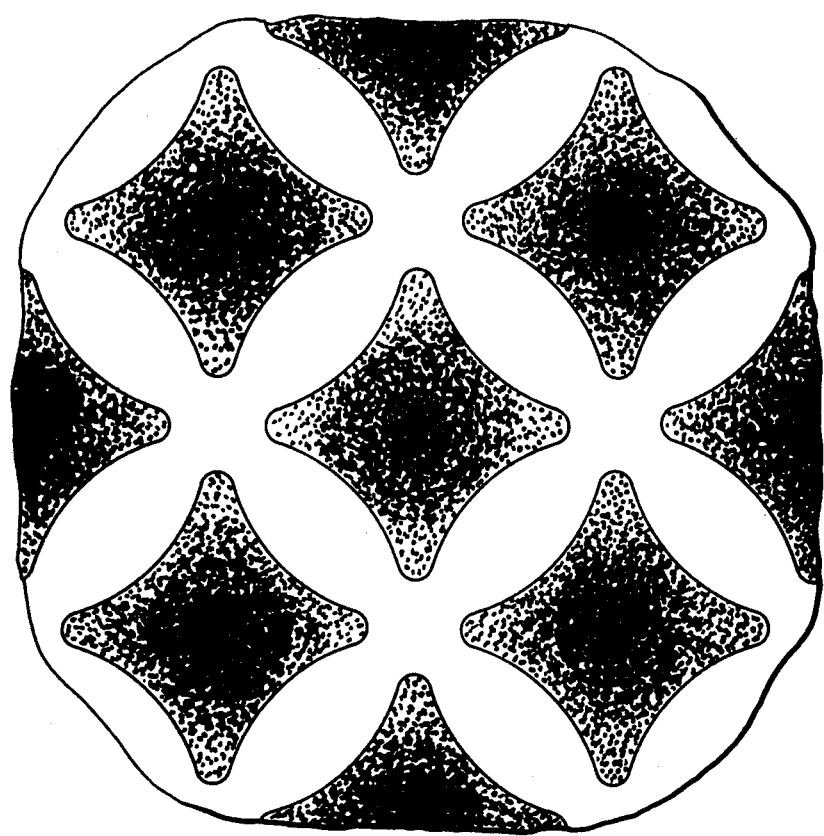
FIG. 3 is an illustration of the lateral screen used for the present method.
Figure 4:
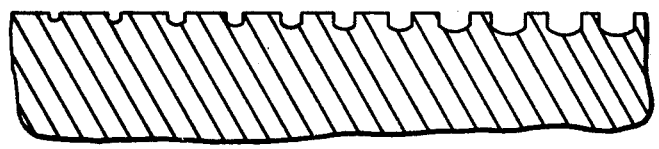
FIG. 4 is a schematic illustration of the results of the present method in producing an etched printing cylinder.
Figure 5:
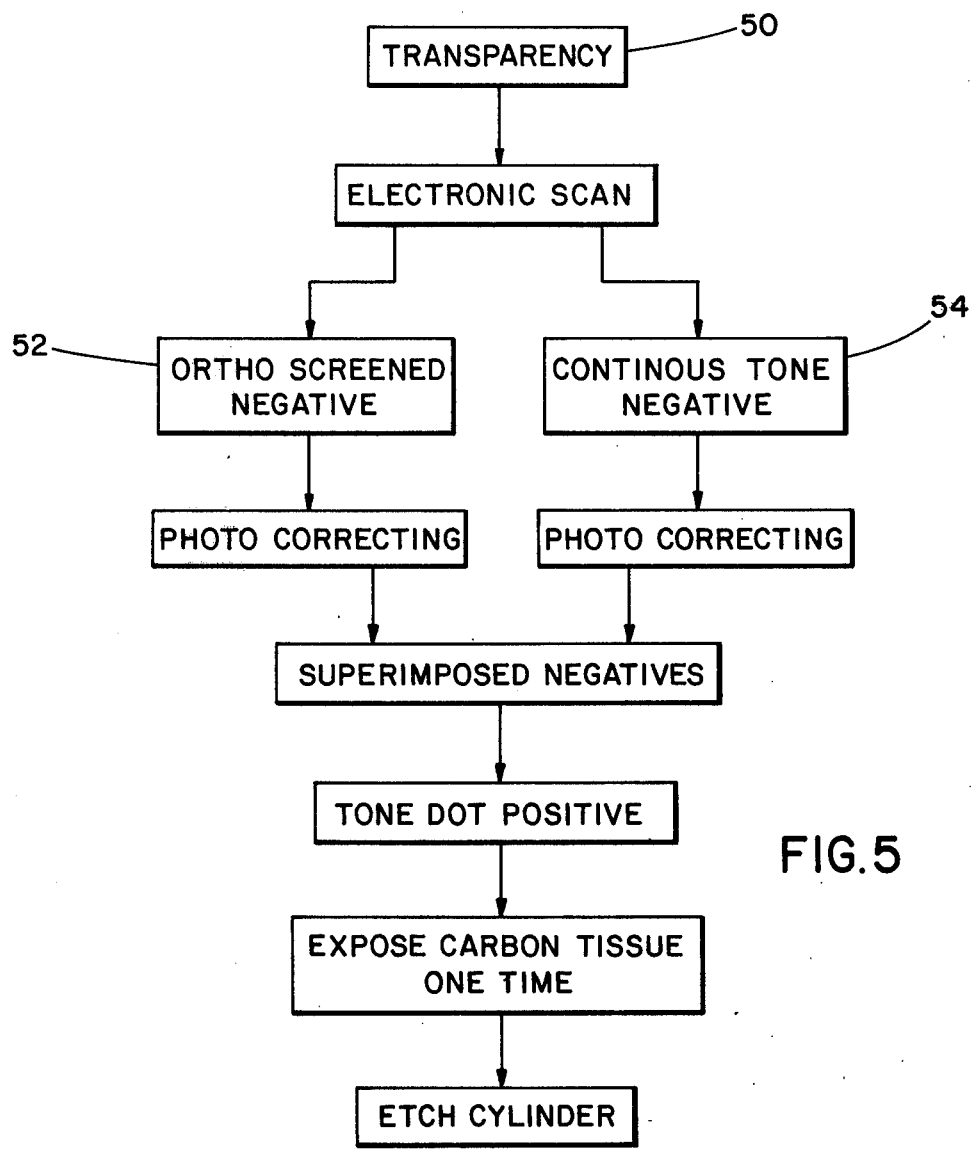
FIG. 5 is a flow diagram of a modified form of the invention.

In offset, a halftone screen (checkerboard) is used to make the negatives and positives. In the present gravure method a lateral type screen is used, as indicated in FIG. 3. In the present method a screened negative in sharp focus is made on orthochromatic film to obtain maximum detail and color separation. A second negative, referred to as a continuous tone negative, is made with the same focus. The two negatives are then superimposed to produce a variable tone dot positive (FIGS. 2 and 5). This positive will have fine dots in the highlight areas with a tonal value of approximately 0.35 as measured by a transmission densitometer commonly used in the trade. For increasing tone values, the size and density of the dots increase until the maximum tonal value is reached having a densitometer reading of 1.65. Alternatively (FIG. 6) the two negatives may be used to produce separate positives.

DETAILED DESCRIPTION

Figure 1:
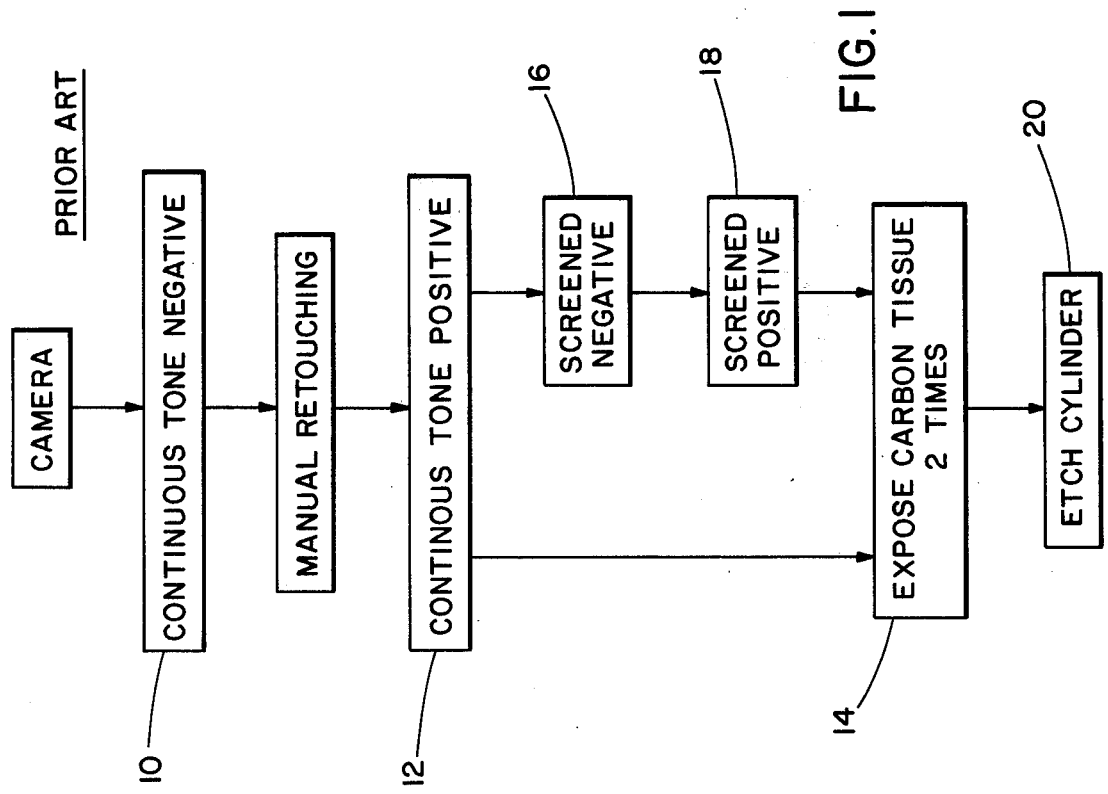
FIG. 1 is a flow diagram of the prior art hard dot process.

Referring now to FIG. 1, a flow diagram of the hard dot technique is illustrated. The hard dot technique which is a prior art method, was developed as an alternative to the Dultgen process of U.S. Pat. No. 2,096,794. For several reasons, the Dultgen process was not satisfactory. In particular, Dultgen utilized a halftone or checkerboard screen which does not yield satisfactory results. A further drawback of that process was the limitation due to the use of glass negatives, making it difficult to place negatives in register to produce a combined positive.

The hard dot process was developed for long press runs and, as described earlier, was found to be relatively satisfactory in end result. The serious drawback of the hard dot method is the extensive amount of manual retouching, setup and layout required to produce the end product. As indicated in FIG. 1, in the hard dot method a continuous tone negative 10 on conventional film is made for each color gravure cylinder. Next, extensive manual retouching and layout of this negative is required by skilled gravure artists for upwards of 10 hours. From the retouched continuous tone negative 10, a continuous tone positive 12 is produced. This positive is then exposed on a carbon tissue resist 14.

Also produced from the continuous tone positive is a contrast or screened negative 16 again on conventional film. The negative is produced in a manner well known in the art in a vacuum frame from the continuous tone positive. The contrast negative 16 is produced utilizing a magenta colored screen of the type illustrated in FIG. 3. This screen differs from the halftone screens utilized in the Dultgen process in that, rather than a checkerboard configuration, a 150-line-per-inch grid is utilized wherein the space between the grids is formed of a hard dot material which is darkest at its center and becomes more transparent toward the edges which, desirably, are of a pillow configuration to correct for lens and etching distortion inherent in the process. Thus, the pillow cushions appear as perfect squares in the final etch.

In the hard dot process a screened positive 18 is produced from the screened negative 16. This screened positive is similarly exposed on the carbon tissue 14 in the same manner as the continuous tone positive 12. It is noted that additional problems are present in this procedure due to the necessity for maintaining very strict and exact alignment or register of the two exposures upon the carbon tissue 14.

The twice exposed carbon tissue, in a manner well known in the gravure art, is then utilized as an etching resist on the cylinder to be etched. In the portions where the cylinder is covered by the carbon tissue it does not etch, while it does etch in the uncovered areas.

Referring now to FIG. 2, the method of the present invention is illustrated. Unlike the hard dot technique, the present invention employs two separately produced negatives 30 and 32 for each cylinder to be etched. Negative 30 is a screened contrast negative produced on orthochromatic film. By "orthochromatic film" it is meant film suitable for lithography having a very high contrast; that is, the film produces a negative either black or white at a given point—there are no intermediate gray shades. Such films are now commercially available as for example, "Ortho 3", manufactured by Kodak.

The ortho negative can be produced in a camera by placing a gray lateral screen between the lens and the ortho film. The camera is then brought into sharp focus on the subject and an exposure made. Alternatively, the ortho screened negative can be made in a vacuum frame from a transparency or in an enlarger well known in the art. The screen used for the ortho screened negative, regardless of method used, is similar to the screen used in the hard dot technique except that the screen must be of a gray shading rather than the magenta in order to produce acceptable results.

Negative 32 is a continuous tone negative having intermediate tones rather than a screened orthochromatic negative. It is similarly produced, for example, in a camera the screen is removed, the film is changed and then the subject is photographed at the same sharp focus. The present method thus utilizes two independently developed negatives, unlike the hard dot process. In the present method the continuous tone negative 32 regular film is not manually retouched as it is not required. The negatives 30 and 32 are corrected photographically in the camera as is done in present-day offset printing. It will thus be appreciated that the extensive manual retouching required in the hard dot process is virtually eliminated. Simple photographic correction of the negatives 30 and 32 produces a superior gravure cylinder.

The photographically corrected negatives 30 and 32 are then superimposed in exact register to produce a tone dot positive 34. The term "tone dot positive" has been coined by the inventor in order to describe a positive formed from a superposition of the screened and continuous tone negatives 30 and 32. This tone dot positive is then utilized to expose the carbon tissue resist 36 in a single exposure.

Both the present invention and the hard dot method produce etchings which vary in both depth and width yielding a significantly improved image definition over the conventional gravure method. Superior image reproduction in the present method is achieved due to the fact that it is necessary to lay out only one positive instead of the two required for the hard dot process. Additionally, significant amounts of time are saved because no retouching of the continuous tone negative is necessary in the present invention. Further, minor correction of the negatives is done photographically in the camera rather than manually.

This is possible because the density range of an orthochromatic screened negative is significantly greater than the range of the continuous tone negative used in the hard dot process. Thus, the contiuous tone negative 10 has a density range of approximately 0.35 to 1.65 on a densitometer typically in steps of 0.1, while the range of densitometer readings for the orthochromatic negative 30 runs from approximately 0.0 to 4.0 in smaller steps. As a result of this increased range, the present method has a significantly increased response and accuracy over the hard dot method. The large range of the screened negative 30 eliminates the need for hand correcting and touch-up, simple photographic correction being sufficient. Ultimately it is necessary to return to the standard gravure densitometer range of 0.35 to 1.65. This is accomplished inherently during production of the tone dot positive 34 used to expose the carbon tissue resist 36.

In order to emphasize the above discussion, an example of the advantage of the present technique will be given. Assuming that the yellow cylinder is being prepared, a screened orthochromatic and a continuous tone negative both in sharp focus will be produced with a yellow plate filter over the camera. Conventionally, when producing a yellow negative, it is necessary to eliminate blue tones to avoid green. In the hard dot process and in most conventional gravure processes, elimination of the blue tones is done by hand by skilled gravure craftsmen and requires many hours of retouching. In the present method, however, the elimination of the blue tones is automatically accomplished by filtering due to the extended range of the orthochromatic film thereby eliminating the need for manual retouching. All hand correcting is thus eliminated and after the positive is made, the gravure plate can be quickly produced in a significantly shorter period of time than by the standard techniques.

As has been mentioned earlier, the present invention requires a gray lateral screen of the type illustrated in FIG. 3. The Dultgen patent contemplated use of a halftone or checkerboard screen in the only embodiment of that reference which is similar to the present method. It is noted that the Dultgen method is unsatisfactory in this respect as well as for the reasons pointed out earlier. This gray lateral screen will be referred to in the remaining portion of the specification as a lateral pillow cushion screen.

Referring to FIG. 5, a modified form of the invention is illustrated. This method is utilized when it is desired to produce a screened orthochromatic and continuous tone negative by electronic scanning. The process utilizes a color transparency 50, however produced, which is then electronically scanned in the usual manner. From the scanning, two independent negatives 52, 54 are produced. Negative 52 is the screened negative produced or orthochromatic film with a gray lateral screen interposed. Negative 54 is the continuous tone negative produced without the lateral screen on ordinary film. After negatives 52 and 54 have been produced, the method continues as described in connection with the FIG. 2 embodiment.

Referring now to FIG. 6, an alternate embodiment of the invention is illustrated. This method is identical to the methods of FIGS. 2 and 5 in that two separately produced negatives 60 and 62 must be made for each cylinder to be etched. As with the FIG. 2 method, photo correction takes place. Unlike the method of FIGS. 2 and 5, however, the step of superimposing the separately produced negatives is replaced with the steps of producing an orthochromatic screened positive 64 from the orthochromatic negative 60 and producing a continuous tone positive 66 from the continuous tone negative 62. The carbon tissue for producing the cylinder etch is then exposed two times, once with the positive 64 and once with positive 66. As is known in the art, when carbon tissue etch is twice exposed, such exposure must be carefully registered.

The method disclosed in FIG. 6 is slightly less desirable than the methods of FIGS. 2 and 5 in that the additional steps of producing the positives 64 and 66 are required. The methods of FIGS. 2 and 5 are more efficient. The FIG. 6 method, however, has the advantage of being similar in mechanical sequence to present day gravure techniques. That is, after the unique steps of the present invention, including producing the two distinct negatives 60 and 62, the procedure of the FIG. 6 method is quite similar to present day techniques. Press men trained in the latter techniques can readily adapt to the FIG. 6 procedure while a more thorough indoctrination may be required to utilize the methods of FIGS. 2 and 5. It will be apparent that the FIG. 5 method can be utilized to produce the required negatives and then the FIG. 6 technique can be employed to produce the gravure surface if electronic scanning is desired.

While I have shown and described embodiments of this invention in some detail, it will be understood that this description and illustrations are offered merely by way of example, and that the invention is to be limited in scope only by the appended claims.

I claim:

1. A method of producing a gravure printing surface comprising the steps of:
    a. photographically producing a continuous tone negative in sharp focus;
    b. photographically producing a grey screened negative on orthochromatic film also in sharp focus;
    c. superimposing the continuous tone and screened negatives in register;
    d. producing a tone dot positive from the superimposed negatives; and
    e. producing said gravure printing surface from said positive by exposing a carbon tissue resist and etching in the conventional manner.

2. The method of claim 1 including the step of repeating steps (a) through (e) while employing a different color filter for each repetition to produce a plurality of printing surfaces each corresponding to the color filter used to produce it and collectively adapted to produce color gravure printing.

3. The method of claim 1 wherein said orthochromatic film has a tonal range of approximately 0.0 to 4.0 as measured on a transmission densitometer.

4. The method of claim 1 wherein said step of superimposing includes the substep of placing said negatives in register in a vacuum frame.

5. The method of claim 1 further including the step of photographically atering said negatives to effect necessary correcting.

6. The method of claim 1 wherein the steps of photographically producing a continuous tone and screened negative employ a camera in which said negatives are exposed.

7. The method of claim 1 wherein the steps of photographically producing a continuous tone and screened negative employ a vacuum frame in which said negatives are produced.

8. The method of claim 1 wherein the steps of photographically producing a continuous tone and screened negative employ an electronic scanner.

9. The method according to claim 6 wherein the step of photographically producing the screened negative includes the substeps of:
   a. inserting a pillow cushion screen between the camera lens and said orthochromatic film; and
   b. exposing said orthochromatic film through said screen to produce said screened negative.

10. The method of claim 9 wherein said screen is gray having approximately 150 lines per inch.

11. The method according to claim 7 wherein the step of producing said screened negative includes the substeps of:
    a. placing a pillow cushion screen over the orthochromatic film in said vacuum frame; and
    b. exposing said orthochromatic film in said frame to produce said screened negative.

12. The method according to claim 8 wherein the steps of producing a continuous tone negative and screened negative includes the substeps of:
    a. electroncially scanning a color transparency to determine tone value information;
    b. exposing a negative with the tone value information of said scanner to produce said continuous tone negative; and
    c. exposing an orthochromatic negative with the tone value information through a pillow cushion screen to produce said screened negative.

13. A method of producing a gravure printing surface comprising the steps of:
    a. photographically producing a continuous tone negative in sharp focus;
    b. photographically producing a screened negative on orthochromatic film also in sharp focus;
    c. producing a continuous tone positive from the negative of step (a);
    d. producing an othochromatic screened postive from the negative of step (b);
    e. exposing a carbon tissue resist to the positives of steps (c) and (d) in the conventional manner; and
    f. etching said printing surface from the twice exposed resist in the conventional manner.

14. The method of claim 13 including the step of repeating steps (a) through (f) while employing a different color filter for each repetition to produce a plurality of printing surfaces each corresponding to the color filter used to produce it and collectively adapted to produce color gravure printing.

15. The method of claim 13 wherein said orthochromatic film has a tonal range of approximately 0.0 to 4.0 as measured on a transmission densitometer.

16. The method of claim 13 further including the step of photographically altering said negatives to effect necessary correcting.

17. The method of claim 13 wherein the steps of photographically producing a continuous tone and screened negative employ a camera in which said negatives are exposed.

18. The method of claim 13 wherein the steps of photographically producing a continuous tone and screened negative employ an electronic scanner.

19. The method according to claim 17 wherein the step of photographically producing the screened negative includes the substeps of:
    a. inserting a pillow cushion screen between the camera lens and said orthochromatic film; and
    b. exposing said orthochromatic film through said screen to produce said screened negative.

20. The method according to claim 18 wherein the steps of producing a continuous tone negative and screened negative includes the substeps of:
    a. electronically scanning a color transparency to determine tone value information;
    b. exposing a negative with the tone value information of said scanner to produce said continuous tone negative; and
    c. exposing an orthochromatic negative with the tone value information through a pillow cushion screen to produce said screened negative.

* * * * *